United States Patent [19]
Amerasekera et al.

[11] Patent Number: 6,081,002
[45] Date of Patent: Jun. 27, 2000

[54] LATERAL SCR STRUCTURE FOR ESD PROTECTION IN TRENCH ISOLATED TECHNOLOGIES

[75] Inventors: E. Ajith Amerasekera, Plano; Bernhard H. Andresen, Dallas; Amitava Chatterjee, Plano, all of Tex.

[73] Assignee: Texas Instruments Incorporated, Dallas, Tex.

[21] Appl. No.: 09/085,818

[22] Filed: May 27, 1998

Related U.S. Application Data

[60] Provisional application No. 60/047,902, May 29, 1997.

[51] Int. Cl.[7] .................................................. H01L 29/74
[52] U.S. Cl. ......................... 257/173; 257/371; 257/175; 361/56; 361/58
[58] Field of Search ...................... 257/355, 356, 257/360, 361, 362, 363, 365, 367, 546, 547, 371, 133, 175, 111, 122, 124, 141, 173; 361/56, 58

[56] References Cited

U.S. PATENT DOCUMENTS

| | | | |
|---|---|---|---|
| 5,400,202 | 3/1995 | Metz et al. | 361/56 |
| 5,465,189 | 11/1995 | Polgreen et al. | 361/58 |
| 5,637,892 | 6/1997 | Leach | 257/362 |
| 6,016,002 | 1/2000 | Chen et al. | 257/546 |

*Primary Examiner*—Tom Thomas
*Assistant Examiner*—Shouxiang Hu
*Attorney, Agent, or Firm*—Jacqueline J. Garner; Wade James Brady III; Frederick J. Telecky, Jr.

[57] ABSTRACT

A protection device for trench isolated technologies. The protection device includes a lateral SCR (100) that incorporates a triggering MOS transistor (120) with a first gate electrode (116) connected to the cathode (112) of the SCR (100). The anode (110) of the lateral SCR (100) is separated from the nearest source/drain region (122) of the triggering MOS transistor (120) by a second gate electrode (132) rather than by trench isolation. By using the second gate electrode (132) for isolation instead of trench isolation, the surface conduction of the lateral SCR (100) in unimpeded.

19 Claims, 2 Drawing Sheets

LATERAL SCR STRUCTURE FOR ESD PROTECTION IN TRENCH ISOLATED TECHNOLOGIES

This application claims priority under 35 USC § 119 (e) (1) of provisional application No. 60/047,902, filed May 29, 1997.

FIELD OF THE INVENTION

The invention is generally related to the field of ESD protection for integrated circuits (IC) and more specifically to lateral SCR structures for ESD protection of trench isolation IC technologies.

BACKGROUND OF THE INVENTION

Electrostatic discharge (ESD) may cause damage to semiconductor devices on an integrated circuit during handling of the integrated circuit chip package. Prevention of such damage generally is provided by protection circuits incorporated into the chip of the integrated circuit. In general, such protection circuits include a switch which is capable of conducting relatively large currents during an ESD event. Various devices such as a Silicon Controlled Rectifier (SCR) have been utilized to provide the switching function required to essentially shunt the protected circuitry during an ESD event. Previous circuits and structures used for ESD protection can withstand high levels of ESD stress. However, recent advances in technology have produced devices which can fail at voltage levels lower than the triggering voltages of some prior art protection circuits.

One protection device having a lower trigger voltage is shown in FIG. 1. This device is known as a LVTSCR (low voltage threshold SCR) and includes a lateral SCR that incorporates a trigger nMOS transistor. The protection device is a gated SCR structure 10 having a polysilicon gate 12 connected to ground. SCR structure 10 comprises an anode 14 connected to p+ region 16 and n+ region 18 both of which are located in an n-well 20. The cathode 22 of SCR structure 10 is an n+ region 24 connected to ground and polysilicon gate 12. The trigger nMOS comprises two n+ regions 24 and 28 (i.e., the source/drain regions) separated by gate 12. N+ region 24 is also the cathode of the SCR and both n+ region 24 and gate 12 are connected to ground. In operation, the parasitic bipolar transistor 26 associated with gate 12 (of the trigger nMOS) will begin to conduct current at a lower voltage level than the triggering voltage of a typical SCR. The current conducted through parasitic bipolar transistor 26 triggers SCR structure 10, which, in turn, dissipates the ESD event. Polysilicon gate 12 connected to ground thus reduces the triggering voltage of a typical SCR structure from about 50 volts to about 10–15 volts in a 0.5 micron CMOS process.

The protection device of FIG. 1, however, uses field oxide or LOCOS isolation 21 between active areas. Currently, LOCOS isolation is being replaced with shallow trench isolation. Shallow trench isolation (STI) can require less surface area and thus allow for tighter densities on an integrated circuit. Unfortunately, when the LOCOS isolation of the device of FIG. 1 is replaced with shallow trench isolation, which extends deeper into the substrate surface, the holding voltage and trigger current of the lateral SCR both increase. This is due to the fact that the trench isolation interferes with the surface conduction of the lateral SCR. This can result in the trigger nMOS portion of the device of FIG. 1 failing before the lateral SCR is fully on or a high on-resistance for the SCR. The ESD failure threshold of the LVTSCR with trench isolation is approximately 1000 V for a 50 micron wide device compared to greater than 3000 V for a LOCOS isolated device.

SUMMARY OF THE INVENTION

A protection device for trench isolated technologies is disclosed herein. The protection device includes a lateral SCR that incorporates a triggering MOS transistor gate to lower the triggering voltage of the protection device. One terminal of the lateral SCR is separated from the triggering MOS transistor gate (and any associated source/drain regions) by an isolating transistor gate rather than by trench isolation. By using the isolating transistor gate for isolation instead of trench isolation, the surface conduction of the lateral SCR in unimpeded.

An advantage of the invention is providing a lateral SCR structure for ESD protection in trench isolated technologies.

Another advantage of the invention is providing a lateral SCR structure for ESD protection in trench isolated technologies having increased protection levels over the prior art.

Another advantage of the invention is providing a lateral SCR structure for ESD protection in trench isolated technologies that has similar operating characteristics as that for LOCOS isolated technologies.

These and other advantages will be apparent to those of ordinary skill in the art having reference to the specification in conjunction with the drawings.

DETAILED DESCRIPTION OF THE EMBODIMENTS

The invention may be placed on an integrated circuit (IC) that uses trench isolation to protect the IC from ESD conditions. The invention is connected to a pad (either input or output) of the IC. Multiple protection devices according to the invention may be placed on each IC. The invention will be described in conjunction with a protection device for output pads of a low voltage integrated circuit (IC). It will be apparent to those skilled in the art that the invention is also applicable to input pads and higher voltage ICs.

Figure 1:
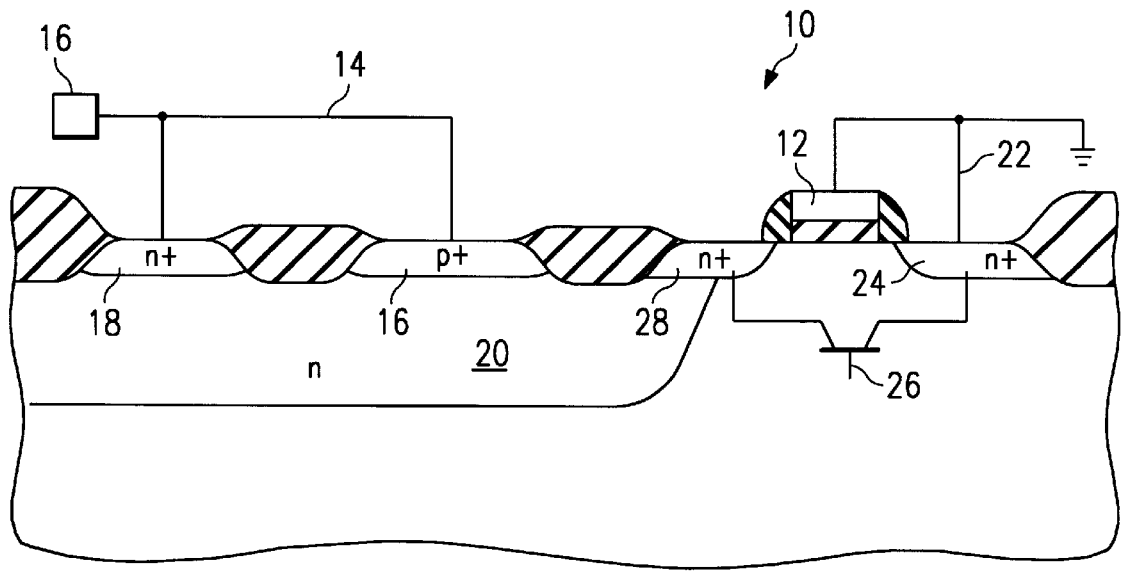
FIG. 1 is a cross-sectional diagram of a prior art lateral SCR for LOCOS isolated technologies.
Figure 2:
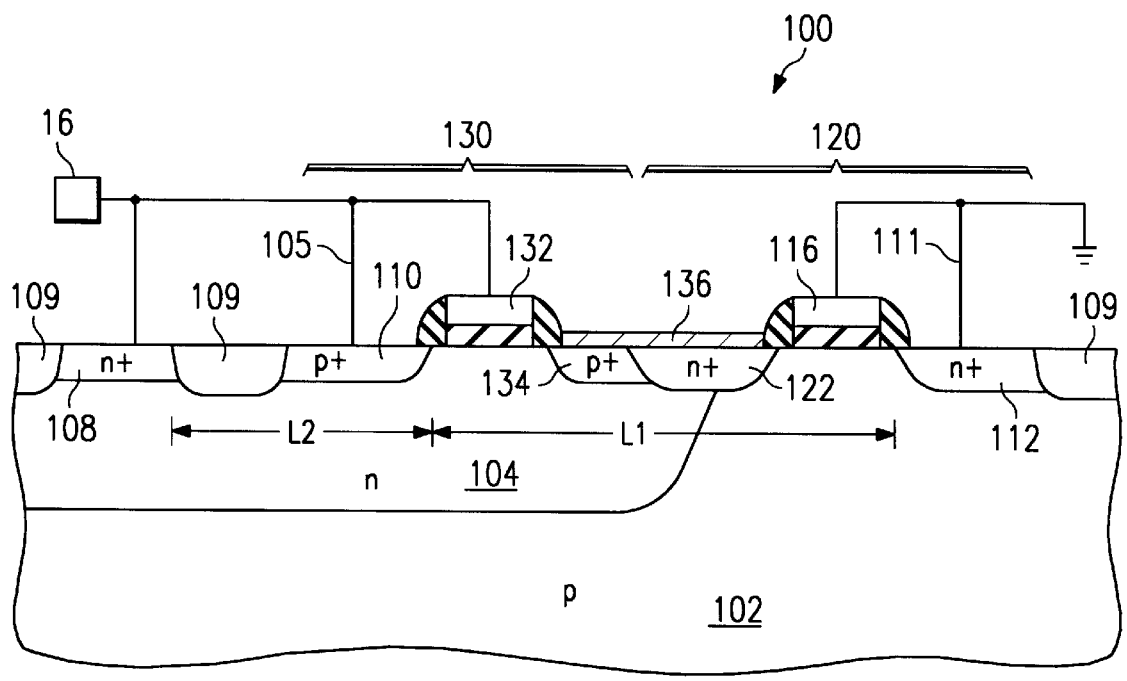
FIG. 2 is a cross-sectional diagram of a lateral SCR for trench isolated technologies according to the invention.

A protection device according to the invention is shown in FIG. 2. The protection device is a LVTSCR 100. LVTSCR 100 includes a triggering nMOS transistor 120 with its gate electrode tied to ground and an isolating pMOS transistor 130 with its gate electrode, drain and body connected to the pad 16. Device 100 is formed in a substrate 102. The anode 105 of the SCR 100 comprises a p+ region 110 and a n+ region 108 formed in n-well 104. N-well 104 is lightly doped with a n-type dopant such as phosphorous. Regions 108 and 110 are connected together and to output pad 16. Regions 108 and 110 will typically be physically separated by one of trench isolation regions 109. Trench isolation regions 109 are also used to isolate SCR 100 from other devices (not shown). The cathode 111 of SCR 100 comprises a n+ region 112 formed directly in substrate 102. Region 112 is connected to ground. As used herein, ground could be, for example, a shunting power bus.

Triggering nMOS transistor 120 has a gate electrode 116 (typically comprising polysilicon) and gate insulator 114 (typically comprising silicon dioxide). Other gate materials may alternatively be used. Gate electrode 116 is connected to the same potential (e.g., ground) as the source region 112 of nMOS transistor 120. N+ region 122 is located at least partially in the substrate 102 and at least contacts nwell 104. Preferably, however, n+ region 122 is formed partially in substrate 102 and partially in nwell 104. N+ region 122 serves as the drain region of nMOS transistor 120 and is connected through nwell 104 and n-well contact, region 108, to the pad 16. N+ region 112 forms a source region of transistor 120 and is connected to ground.

The gate electrode 132 of pMOS device 130 is used to separate the p+ anode 110 from the n+ trigger diffusion 122. Gate electrode 132 replaces the (trench) isolation structure normally placed at that location. With the absence of trench isolation, lateral surface conduction of the lateral SCR is unimpeded.

The pMOS device 130 is located in nwell 104. Thus the body (n-well 104) of pMOS device 130 is connected to the pad 16. The gate electrode 132 and the drain region, p+ region 110, of pMOS device 130 are also connected to the pad 16. Thus, p+ region 110 forms both the anode of the SCR and the drain region of the pMOS device. An additional p+ region 134 may be used as the source region of pMOS device 130. P+ region 134 and n+ region 122 are connected together, for example by siliciding the two regions using silicide region 136. P+ region 134 is thus also connected to the pad 16 through n+ region 122, n-well 104, and nwell contact 108.

In normal operation, both triggering transistor 120 and SCR 100 will be non-conducting. Because the gate electrode 132, body (nwell 104), drain (anode 110) and source 134 are all connected to the pad 16, no current will flow through pMOS device 130 either during normal operation. Under ESD conditions, the n+ region 122 to substrate junction avalanches, the lateral NPN (defined by regions 122, 102 and 112) begins to conduct current, and the electron current through the nwell 104 resistor, defined by L2, causes the pnp (defined by regions 110, 104, 102) to conduct current and the SCR 100 triggers. The holding voltage of the SCR is defined by L1 which needs to be as small as possible for best ESD performance, but a minimum level may be required for a high holding voltage during normal operation in some applications.

As in the prior art LVTSCR, the size of triggering transistor 120 desired depends on the desired trigger voltage. The trigger voltage for this device is the junction breakdown of transistor 120. Preferably, this is designed to be greater than the holding voltage of the SCR and below that which would stress the internal circuitry being protected. (Methods for designing the holding voltage of a SCR are well known in the art and will not be discussed here.) The trigger voltage should be high enough so that transistor 120 does not leak during normal operation. For example, the trigger voltage may be between the holding voltage for the SCR and Vcc (e.g., 2–5 V).

Optionally, a resistor may be placed between the nMOS transistor gate 116 and ground to further lower the triggering voltage of the device. A protection device comprising a SCR incorporating a nMOS transistor that has a resistor between the gate of the nMOS transistor and ground and the advantages thereof are discussed further in co-pending patent application Ser. No. 08/302,145, filed Sep. 7, 1994, naming inventors Chatterjee et al, assigned to Texas Instruments, Incorporated and hereby incorporated by reference.

Figure 3:
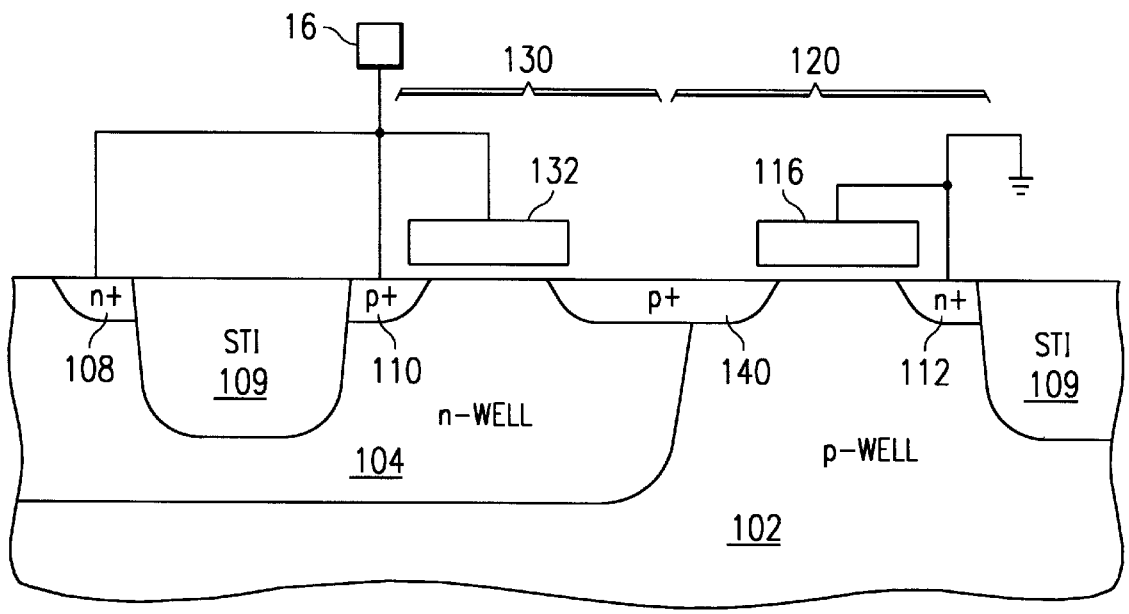
FIG. 3 is a cross-sectional diagram of a first alternative embodiment to the lateral SCR according to the invention.

A first alternative embodiment of the invention is shown in FIG. 3. In this embodiment, the p– region 134 and n+ region 122 are replaced with a p+ region 140 that extend partially within nwell 104 and partially in substrate 102. This embodiment is actually a special case of the structure of FIG. 2, where the width of the n+ region 122 goes to 0. Under ESD conditions, the n well region 104 to substrate junction avalanches, the lateral npn (defined by regions 104, 102 and 112) begins to conduct current, and the electron current through the nwell 104 resistor, defined by L2, causes the pnp (defined by regions 110, 104, 102) to conduct current and the SCR 100 triggers. The holding voltage of the SCR is still defined by L1 which needs to be as small as possible for best ESD performance.

Figure 4:
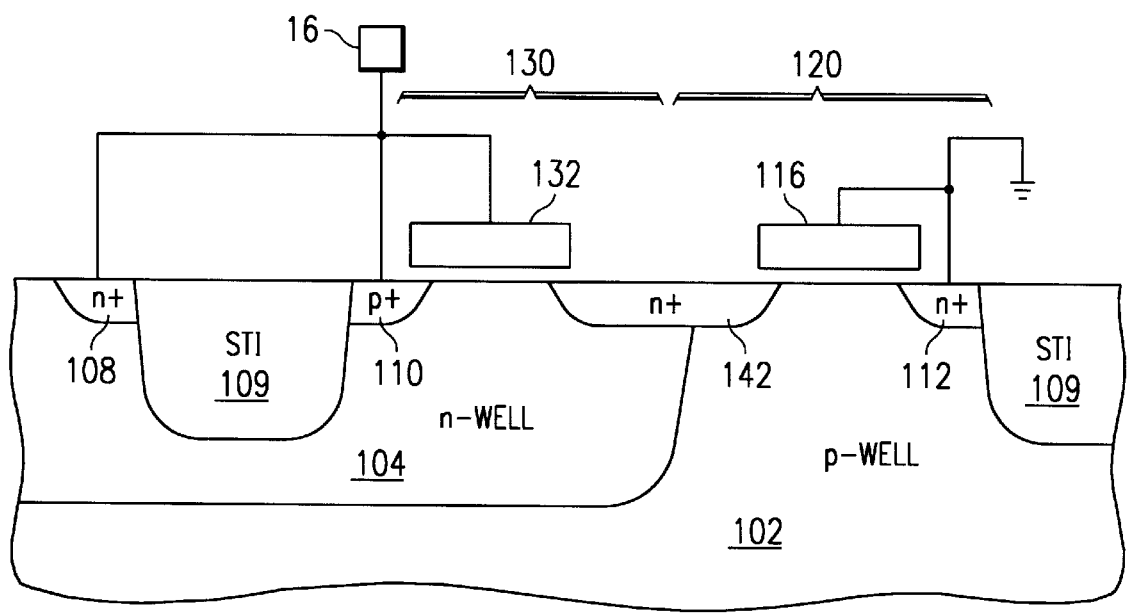
FIG. 4 is a cross-sectional diagram of a second alternative embodiment to the lateral SCR of FIG. 2.

A second alternative embodiment of the invention is shown in FIG. 4. In this embodiment, the p– region 134 and n+ region 122 are replaced with a n+ region 142 that extends partially within nwell 104 and partially in substrate 102. This is also a special case of the structure of FIG. 2, where the width of the p+ region 134 goes to 0. In this second alternative embodiment, an actual pMOS transistor does not exist. The isolation is provided by a diode between the p+ region 110 and n+ region 142.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. The isolating transistor gate 132 may alternatively be connected to p+ regions 134 and/or n+ region 122 instead of pad 16. It is therefore intended that the appended claims encompass any such modifications or embodiments.

What is claimed is:

1. A protection device for a pad of an integrated circuit, comprising:

a lateral silicon-controlled rectifier (SCR) having a first terminal connected to a pad of an integrated circuit and having a second terminal and having a pair of serially coupled n-type and p-type regions;

a triggering MOS transistor gate incorporated into said lateral SCR within one of said pair of n-type and p-type regions; and an isolating MOS transistor gate incorporated into said lateral SCR within the other region of said pair of n-type and p-type regions.

2. The device of claim 1, wherein said triggering MOS transistor gate is connected to said second terminal and forms part of a triggering nMOS transistor, wherein said second terminal forms a cathode of the SCR and a source region of said triggering nMOS transistor.

3. The device of claim 2, wherein said isolating MOS transistor gate is connected to said pad, said isolating MOS transistor gate separating an anode of said SCR from said triggering MOS transistor.

4. The device of claim 1, wherein said isolating MOS transistor gate forms part of a isolating pMOS transistor.

5. The device of claim 4, wherein said first terminal forms an anode that comprises a p-type region and a n-type region separated by a trench isolation structure.

6. The device of claim 5, wherein said p-type region of said anode forms a drain region of said isolating pMOS transistor.

7. The device of claim 1, wherein said first terminal is located in a n-type well region.

8. The device of claim 2, wherein said triggering nMOS transistor comprises a drain region located partially in a substrate and partially in a n-type well region.

9. The device of claim 8, further comprising a p-type source region located in said n-type well region adjacent said drain region of said triggering nMOS transistor.

10. The device of claim 1, wherein said isolating MOS transistor gate is separated from said triggering MOS transistor gate by a n-type doped region located partially in a substrate and partially in a n-type well region.

11. The device of claim 1, wherein said isolating MOS transistor gate is separated from said triggering MOS transistor gate by a p-type doped region located partially in a substrate and partially in a n-type well region.

12. An integrated circuit comprising:

active circuitry;

a plurality of input/output pads for external connections to said active circuitry;

a protection device for at least one pad of said plurality of input/output pads, comprising:

a lateral silicon-controlled rectifier (SCR) having an anode connected to said at least one pad and a cathode connected to ground and having a pair of serially coupled n-type and p-type regions;

a triggering transistor incorporated into said lateral SCR within one of said pair of n-type and p-type regions wherein said cathode forms a source region of said triggering transistor and wherein a first gate electrode of said triggering transistor is connected to ground; and an isolating transistor incorporated into said lateral SCR within the other region of said pair of n-type and p-type regions wherein said isolating transistor has a second gate electrode connected to said at least one pad, said second gate electrode separating the anode of said lateral SCR from said triggering transistor; and a trench isolation structure for isolating said protection device from said active circuitry.

13. The device of claim 12, wherein said anode comprises a p-type region and a n-type region separated by a trench isolation structure.

14. The device of claim 13, wherein said p-type region of said anode forms a drain region of said isolating transistor.

15. The device of claim 12, wherein said anode is located in a n-type well region.

16. The device of claim 15, wherein said triggering MOS transistor comprises a drain region located partially in a substrate and partially in said n-type well region.

17. The device of claim 16, wherein said isolating transistor comprises a p-type source region located in said n-type well region adjacent said drain region of said triggering MOS transistor.

18. The device of claim 15, wherein a channel underlying said second gate electrode is separated from a channel underlying said first gate electrode by a n-type doped region located partially in a substrate and partially in said n-type well region.

19. The device of claim 15, wherein a channel underlying said second gate electrode is separated from a channel underlying said first gate electrode by a p-type doped region located partially in a substrate and partially in said n-type well region.

* * * * *